United States Patent
Imaizumi

(10) Patent No.: US 9,651,594 B2
(45) Date of Patent: May 16, 2017

(54) BATTERY REMAINING POWER PREDICTING DEVICE AND BATTERY PACK

(71) Applicant: Seiko Instruments Inc., Chiba-shi, Chiba (JP)

(72) Inventor: Eiki Imaizumi, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 215 days.

(21) Appl. No.: 14/712,312

(22) Filed: May 14, 2015

(65) Prior Publication Data

US 2015/0331057 A1    Nov. 19, 2015

(30) Foreign Application Priority Data

May 16, 2014 (JP) ................................. 2014-102543

(51) Int. Cl.
| | |
|---|---|
| *G01N 27/416* | (2006.01) |
| *G01R 27/16* | (2006.01) |
| *G01R 31/36* | (2006.01) |
| *G01R 1/20* | (2006.01) |
| *G01R 19/00* | (2006.01) |
| *G01R 19/165* | (2006.01) |

(52) U.S. Cl.
CPC .......... *G01R 27/16* (2013.01); *G01R 31/362* (2013.01); *G01R 31/3624* (2013.01); *G01R 31/3637* (2013.01); *G01R 1/203* (2013.01); *G01R 19/0092* (2013.01); *G01R 19/16542* (2013.01)

(58) Field of Classification Search
CPC ....................................................... G01R 27/16
USPC ............................................................ 324/430
See application file for complete search history.

(56) References Cited

U.S. PATENT DOCUMENTS

| | | | |
|---|---|---|---|
| 6,789,026 B2 | 9/2004 | Barsoukov et al. | |
| 2009/0079415 A1* | 3/2009 | Amada | G01R 19/0092 324/76.11 |
| 2015/0323609 A1* | 11/2015 | Kudo | G01R 1/28 324/433 |

* cited by examiner

*Primary Examiner* — Edward Tso
*Assistant Examiner* — Ahmed Omar
(74) *Attorney, Agent, or Firm* — Brinks Gilson & Lione

(57) ABSTRACT

A battery remaining power predicting device is provided which is equipped with a first voltage detection portion which detects the voltage of a battery, a second voltage detection portion which detects a voltage across a current sense resistor for detecting a load current, a controller which predicts the remaining power of the battery, based on the values of the voltages detected by the first and second voltage detection portions, and a constant current source which allows a constant current to flow through the current sense resistor. The controller is configured to calculate a resistance value of the current sense resistor, based on the detected voltage of the second voltage detection portion when the load current flows, and the detected voltage of the second voltage detection portion when the load current and the constant current flow.

6 Claims, 6 Drawing Sheets

BATTERY REMAINING POWER PREDICTING DEVICE AND BATTERY PACK

RELATED APPLICATIONS

This application claims priority under 35 U.S.C. §119 to Japanese Patent Application No. 2014-102543 filed on May 16, 2014, the entire contents of which is hereby incorporated by reference.

BACKGROUND OF THE INVENTION

Field of the Invention

The present invention relates to a battery pack, and particularly to a battery remaining power predicting device which predicts battery remaining power of a lithium ion rechargeable battery or the like.

Background Art

A rechargeable battery has been used in many devices, starting with a portable device. A battery management system for managing charging/discharging is essential therefor. In particular, it is necessary to more accurately recognize the operation time of the battery during the device operation. Therefore, a battery remaining power predicting device has been used.

A battery pack equipped with a related art battery remaining power predicting device is illustrated in FIG. 6. The related art battery remaining power predicting device 20 is equipped with a CPU 21 which performs a signal processing operation, a RAM 22 used upon the signal processing operation, an ADC 23 for detecting a battery voltage obtained by converting a battery voltage corresponding to one cell of the rechargeable battery 7 by a level translator 26, an ADC 24 for detecting a voltage developed across a current sense resistor 6 for detecting a current of the rechargeable battery 7, and a nonvolatile-memory 25 which stores characteristic data of the rechargeable battery, etc. therein in advance. The present battery remaining power predicting device determines the battery remaining power from the voltage of the rechargeable battery 7, a moving charge quantity obtained by a coulomb counter from the current value of the rechargeable battery 7 measured using the current sense resistor 6, etc. The high accuracy measurement of the voltage and current of the rechargeable battery 7 is essential for a high-accuracy remaining power prediction.

Paying particular attention to current measurement, the current sense resistor 6 is required to have a resistance value with high accuracy.

[Patent Document 1]

U.S. Pat. No. 6,789,026, specification

SUMMARY OF THE INVENTION

In the battery pack equipped with the related art battery remaining power predicting device 20, the current sense resistor 6 has been required to have a large current allowable amount with high accuracy. Therefore, the battery pack was accompanied by a problem that it was expensive and also large in size.

There is provided a battery remaining power predicting device of the present invention, which is equipped with a first voltage detection portion which detects a voltage of a battery, a second voltage detection portion which detects a voltage across a current sense resistor for detecting a load current, a controller which predicts the remaining power of the battery, based on the values of the voltages detected by the first and second voltage detection portions, and a constant current source which allows a constant current to flow through the current sense resistor. The controller is configured to calculate a resistance value of the current sense resistor, based on the detected voltage of the second voltage detection portion when the load current flows, and the detected voltage of the second voltage detection portion when the load current and the constant current flow.

According to a battery pack of the present invention, since the resistance value of a current sense resistor can be measured with high accuracy, a low-accuracy resistor can be used. Thus, the battery pack can be reduced in size and provided at low cost.

Further, as the current sense resistor, a parasitic resistance of a wiring on a charging/discharging control MOSFET or a board can also be utilized. The battery pack can be reduced in size and provided at low cost.

DETAILED DESCRIPTION OF THE PREFERRED EMBODIMENTS

Figure 1:
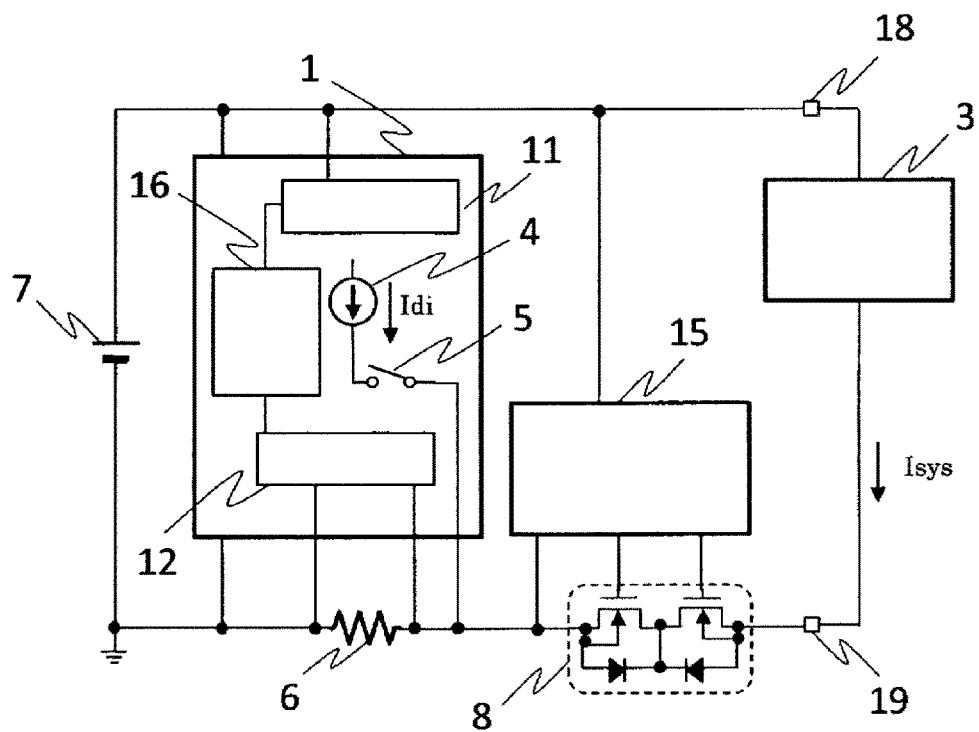
FIG. 1 is a block diagram of a battery pack equipped with a battery remaining power predicting device according to the present embodiment.

FIG. 1 is a block diagram of a battery pack equipped with a battery remaining power predicting device according to the present embodiment. The battery pack in the present embodiment is equipped with a battery remaining power predicting device 1, a current sense resistor 6, a rechargeable battery 7, a charging/discharging control MOSFET 8, a charging/discharging control circuit 15, and external terminals 18 and 19.

The battery remaining power predicting device 1 is equipped with a constant current source 4, a switch 5, voltage detection portions 11 and 12, and a controller 16.

The battery pack of the present embodiment is connected as follows. The battery remaining power predicting device 1 is connected across the rechargeable battery 7. The MOSFET 8 is provided to the external terminal 19. The current sense resistor 6 is provided between the MOSFET 8 and the negative electrode of the rechargeable battery 7. The charging/discharging control circuit 15 is connected across the rechargeable battery 7 and has an output terminal connected to the MOSFET 8. A load 3 is connected to the external terminals 18 and 19. The voltage detection portion 11 has an input terminal to which the rechargeable battery 7 is connected, and an output terminal connected to the controller 16. The voltage detection portion 12 has an input terminal to which both ends of the current sense resistor 6 are connected, and an output terminal connected to the controller 16. The constant current source 4 and the switch 5 are connected to a connection point of the current sense resistor 6 and the MOSFET 8.

The voltage detection portion 11 measures the voltage of the rechargeable battery 7 and outputs it to the controller 16. The voltage detection portion 12 measures the voltage developed across the current sense resistor 6 and outputs it to the controller 16. The controller 16 predicts the remaining power of the rechargeable battery 7, based on information obtained from the voltage detection portion 11 and the voltage detection portion 12. The constant current source 4 allows the known constant current for measuring the resistance value of the current sense resistor 6 to flow into the current sense resistor 6.

The battery remaining power predicting device 1 measures the current consumption of the load 3 to thereby predict the battery remaining power of the rechargeable battery 7. The accurate measurement of the current consumption Isys of the load 3 is essential for highly accurate prediction of the battery remaining power. To this end, it is necessary to accurately recognize the resistance value of the current sense resistor 6. The present invention provides means for accurately measuring the resistance value of the current sense resistor 6.

Assuming that the current consumption of the load 3 is Isys, the current Isys flows through the current sense resistor 6 in a normal operation state in which the switch 5 is being off. Assuming that the resistance value of the current sense resistor 6 is Rss, a sense voltage Vsb developed across the resistor is represented as follows:

$$Vsb = Rss \times Isys \quad (1)$$

Next, the switch 5 is turned on to apply a constant current Idi to the current sense resistor 6. The current of the current sense resistor 6 at this time becomes Isys+Idi. A sense voltage Vsa developed across the current sense resistor 6 is represented as follows:

$$Vsa = (Isys + Idi) \times Rss \quad (2)$$

The resistance value Rss of the current sense resistor 6 can be obtained by the above equations (1) and (2):

$$Rss = (Vsa - Vsb)/Idi \quad (3)$$

That is, the sense voltage Vsb is measured in the normal operation state. The switch 5 is turned on to measure the sense voltage Vsa. The resistance value Rss of the current sense resistor 6 is calculated by the equation (3). By doing this, the resistance value Rss can be obtained from the known constant current Idi without depending on the current Isys. Since the voltage of the current sense resistor 6 can be measured with high accuracy if the accuracy of measurement for the voltage detection portion 12 is made high, the resistance value Rss can also be obtained with high accuracy.

Here, the constant current Idi may be set as appropriate from the requested accuracy of the resistance value Rss and the measurement accuracy of the voltage detection portion 12.

Incidentally, the resistance value Rss of the current sense resistor 6 is stored in, for example, a memory element provided in the controller and used in the calculation of the current consumption Isys of the load 3. Thus, since the measurement of its resistance value is possible in one measurement upon start-up of the system and the like, the current used in the measurement hardly influences the current consumption of the battery remaining power predicting device.

According to the battery remaining power predicting device of the present embodiment, as described above, the resistance value Rss of the current sense resistor 6 can be measured with a high degree of accuracy. Thus, since it is possible to accurately measure the current consumption Isys of the load 3, highly accurate prediction of the battery remaining power of the rechargeable battery 7 is made possible. Further, since the current sense resistor 6 may be a resistor which is low in accuracy and inexpensive, a cost reduction effect is also brought about.

Incidentally, although the battery remaining power predicting device of the present embodiment has been provided with the voltage detection portions 11 and 12 individually, the battery remaining power predicting device may be configured by one voltage detection portion by processing in a time-division manner, the measurement of the battery voltage and the measurement of the voltage across the current sense resistor 6, based on the load current.

Further, although the on/off control of the constant current source 4 has been done by the current source control switch 5, it is known that the on/off control can easily be realized by adding a sleep function or the like to the constant current source 4 itself. Furthermore, the current Isys of the load 3 may of course be Isys=0.

Figure 2:
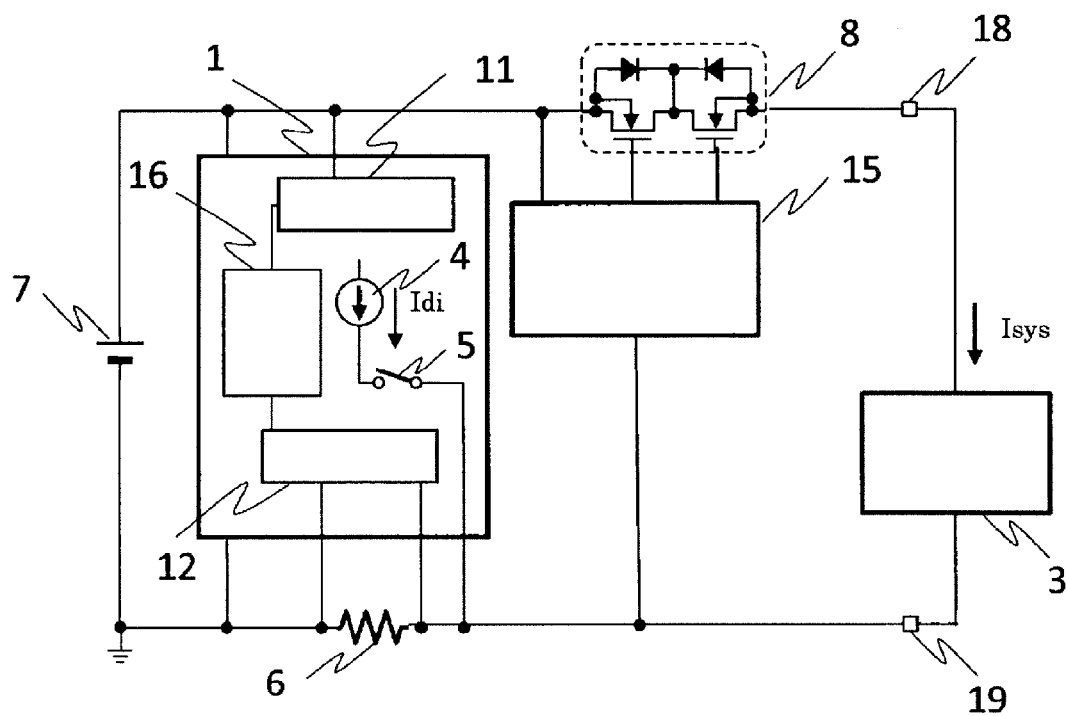
FIG. 2 is a block diagram illustrating another example of the battery pack equipped with the battery remaining power predicting device according to the present embodiment.

FIG. 2 is a block diagram illustrating another example of the battery pack equipped with the battery remaining power predicting device according to the present embodiment. In the example illustrated in FIG. 2, the MOSFET 8 is provided on the positive electrode side of the rechargeable battery 7.

Figure 3:
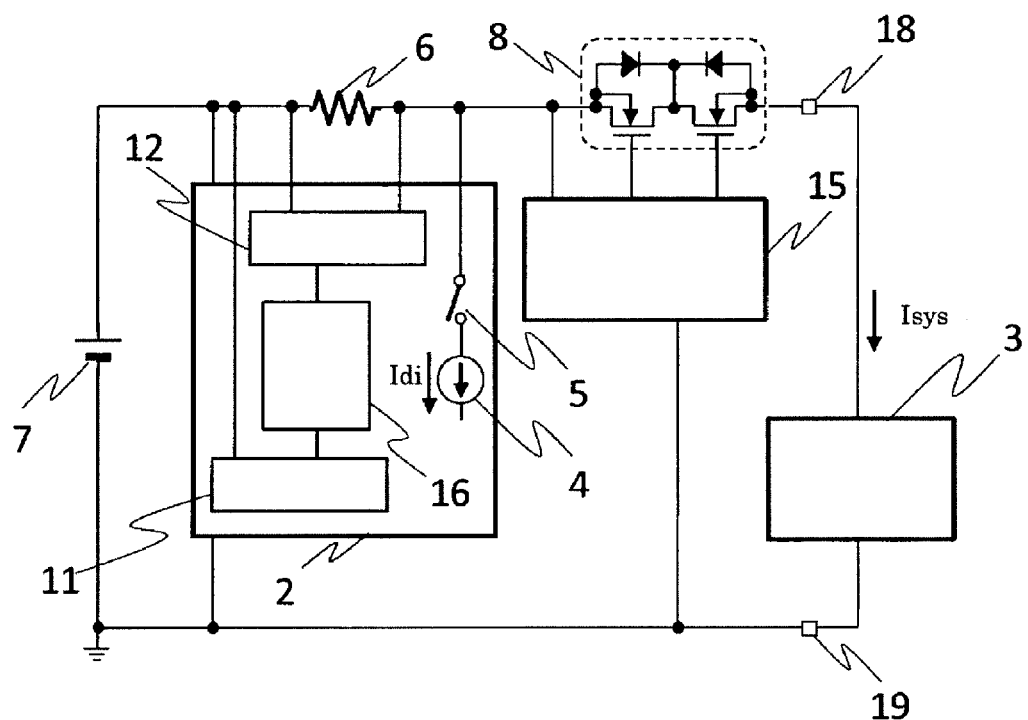
FIG. 3 is a block diagram illustrating a further example of the battery pack equipped with the battery remaining power predicting device according to the present embodiment.

FIG. 3 is a block diagram illustrating a further example of the battery pack equipped with the battery remaining power predicting device according to the present embodiment. The example illustrated in FIG. 3 is an example where the current sense resistor is provided on the positive electrode side of the rechargeable battery 7. Therefore, in the battery remaining power predicting device 1 of the present embodiment, the constant current source 4 is a sink current source, which extracts a current Idi from the current sense resistor 6.

Figure 4:
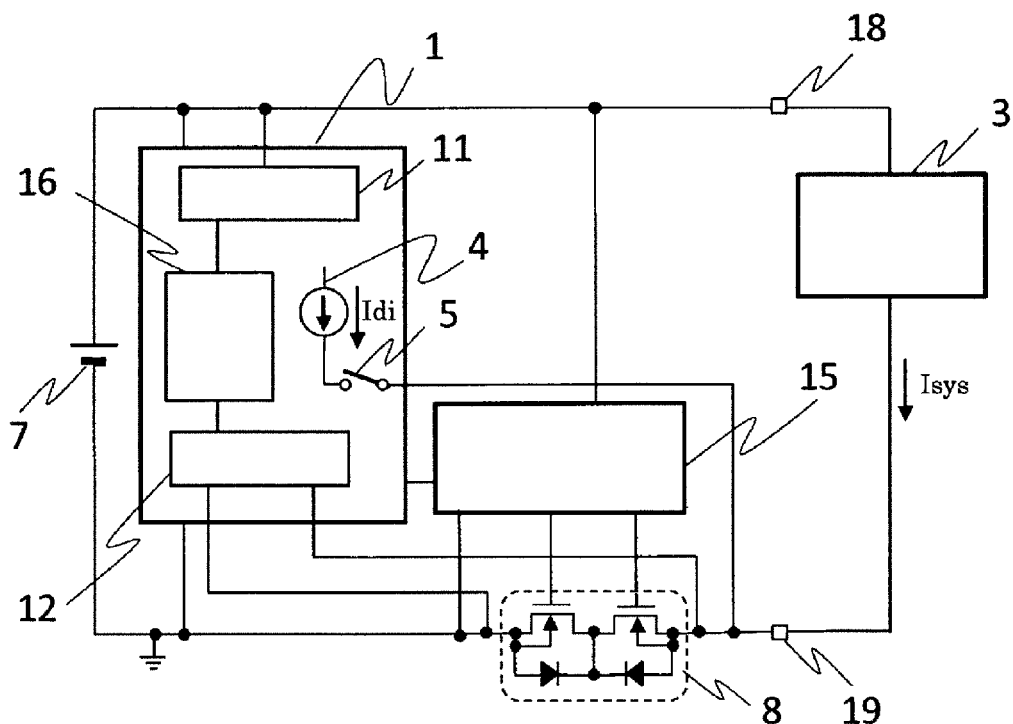
FIG. 4 is a block diagram illustrating a yet another example of the battery pack equipped with the battery remaining power predicting device according to the present embodiment.

FIG. 4 is a block diagram illustrating a yet another example of the battery pack equipped with the battery remaining power predicting device according to the present embodiment. The battery pack in the present embodiment is an example in which the on resistance of the MOSFET 8 provided on the negative electrode side of the rechargeable battery 7 is substituted for the current sense resistor. The resistance value Ron of the on resistance can be obtained as follows as with the battery pack of FIG. 1:

$$Ron = (Vsa - Vsb)/Idi \quad (4)$$

Figure 5:
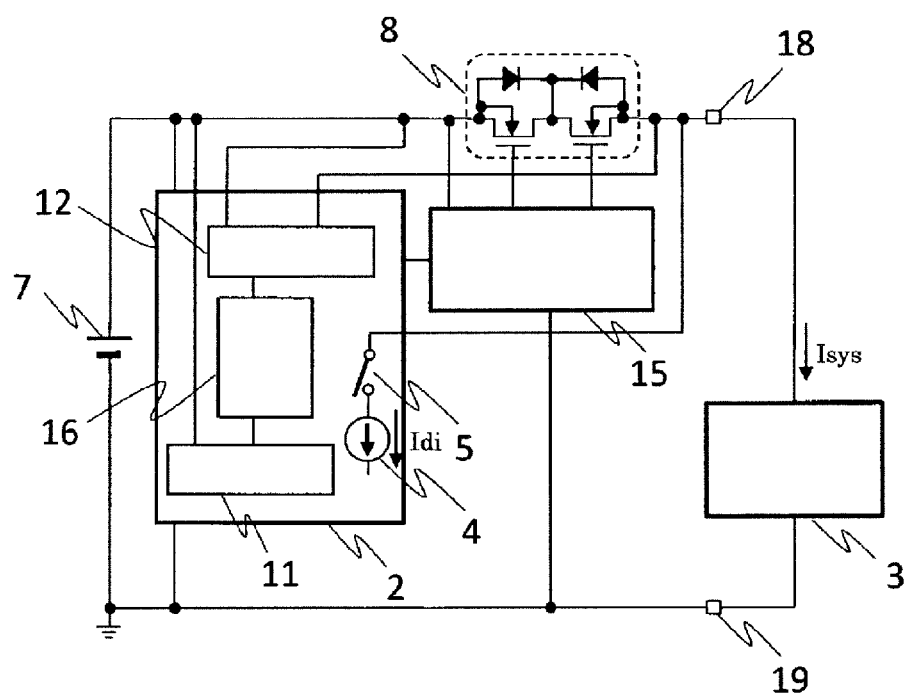
FIG. 5 is a block diagram illustrating a still further example of the battery pack equipped with the battery remaining power predicting device according to the present embodiment.
Figure 6:
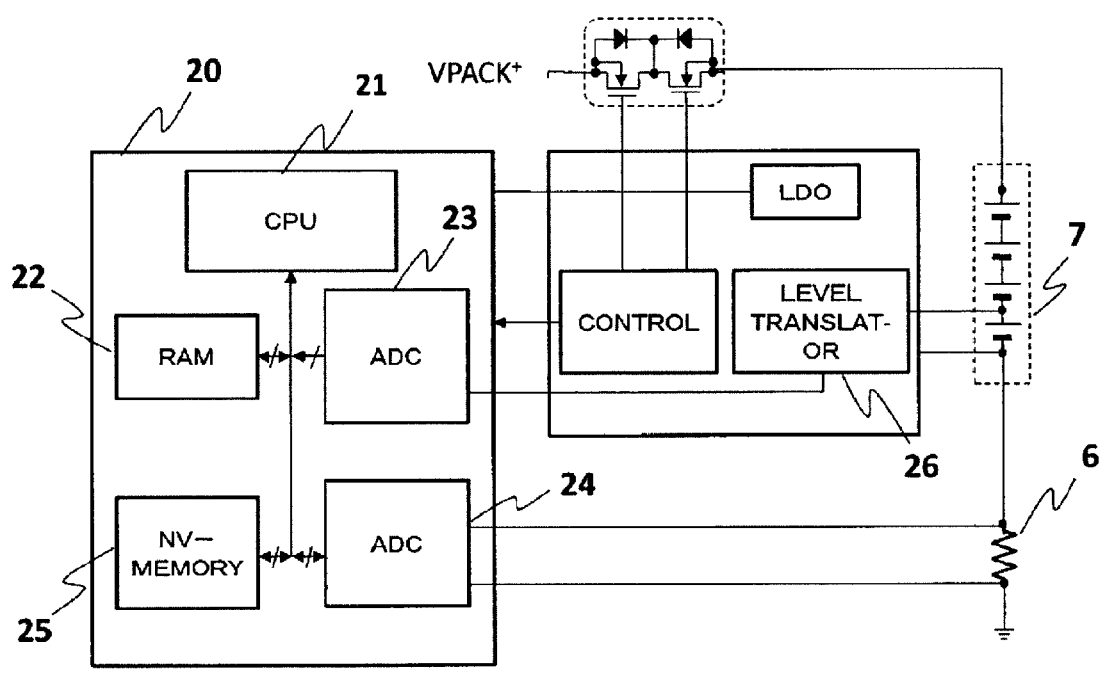
FIG. 6 is a block diagram of a battery pack equipped with a related art battery remaining power predicting device.

FIG. 5 is a block diagram illustrating a still further example of the battery pack equipped with the battery remaining power predicting device according to the present embodiment. The battery pack in the present embodiment is an example in which the on resistance Ron of the MOSFET 8 provided on the positive electrode side of the rechargeable battery 7 is substituted for the current sense resistor.

Here, in the case of the battery packs illustrated in FIGS. 4 and 5, it is necessary that the MOSFET 8 is on when the on resistance Ron of the MOSFET 8 is measured. In that case, information about its turning-on may be transferred between the battery remaining power predicting device 1 and the charging/discharging control circuit 15, or control by a control signal may be done therebetween.

According to the battery packs illustrated in FIGS. 4 and 5 as described above, the use of the on resistance of the MOSFET 8 instead of the related art current sense resistor enables a reduction in the number of board components and is effective in reducing a mounting scale and reducing the cost.

Further, since the current sense resistor 6 of the battery pack in the present embodiment requires no accuracy, the current sense resistor 6 may be substituted even by the parasitic resistance of a board wiring. The current sense resistor 6 is effective in making a size reduction on board mounting and reducing the mounting cost.

What is claimed is:

1. A battery remaining power predicting device which measures a voltage of a battery and a load current to predict remaining power of the battery, said battery remaining power predicting device comprising:
   a first voltage detection portion which detects the voltage of the battery;
   a second voltage detection portion which detects a voltage across a current sense resistor for detecting the load current;
   a controller which predicts the remaining power of the battery, based on the values of the voltages detected by the first and second voltage detection portions; and
   a constant current source which allows a constant current to flow through the current sense resistor,
   said controller calculating a resistance value of the current sense resistor, based on the detected voltage of the second voltage detection portion when the load current flows, and the detected voltage of the second voltage detection portion when the load current and the constant current flow.

2. The battery remaining power predicting device according to claim 1, wherein the first voltage detection portion and the second voltage detection portion are configured by one voltage detection portion.

3. A battery pack, comprising:
   a battery, a current sense resistor, and a load current control MOSFET connected in series between first and second external terminals to which a load is connected;
   a MOSFET control circuit which monitors a state of the battery and controls the MOSFET; and
   a battery remaining power predicting device according to claim 1, which detects the voltage of the battery and the voltage across the current sense resistor to predict the remaining power of the battery.

4. The battery pack according to claim 3, wherein the current sense resistor is arranged in the battery remaining power predicting device.

5. The battery pack according to claim 3, wherein the current sense resistor comprises a parasitic resistance of a wiring on a board.

6. The battery pack according to claim 3, wherein the current sense resistor comprises an on resistance of the MOSFET, and
   wherein the second voltage detection portion detects the load current by a voltage across the MOSFET.

* * * * *